(12) United States Patent
Machida et al.

(10) Patent No.: US 8,089,071 B2
(45) Date of Patent: Jan. 3, 2012

(54) THIN FILM SEMICONDUCTOR DEVICE HAVING CRYSTAL GRAIN BOUNDARIES CYCLICALLY TRAVERSING A CHANNEL PART AND METHOD FOR MANUFACTURING SAME

(75) Inventors: Akio Machida, Kanagawa (JP); Toshio Fujino, Kanagawa (JP); Tadahiro Kono, Tokyo (JP)

(73) Assignee: Sony Corporation, Tokyo (JP)

( * ) Notice: Subject to any disclaimer, the term of this patent is extended or adjusted under 35 U.S.C. 154(b) by 771 days.

(21) Appl. No.: 11/683,272

(22) Filed: Mar. 7, 2007

(65) Prior Publication Data

US 2008/0054266 A1 Mar. 6, 2008

(30) Foreign Application Priority Data

Mar. 13, 2006 (JP) ................. 2006-067272
Dec. 25, 2006 (JP) ................. 2006-347052

(51) Int. Cl.
*H01L 29/10* (2006.01)
(52) U.S. Cl. ............ 257/66; 257/64; 257/72; 257/74; 257/75; 257/E21.133; 257/E21.134; 257/E21.411; 257/E29.273; 257/E29.292; 257/E29.293
(58) Field of Classification Search ........ 257/64, 257/66, 74, 75, E29.292, E21.133, E21.134, 257/72, E21.411, E29.273, E29.293
See application file for complete search history.

(56) References Cited

U.S. PATENT DOCUMENTS

| 5,591,668 A * | 1/1997 | Maegawa et al. | 438/799 |
| 6,753,548 B2 * | 6/2004 | Ogawa et al. | 257/53 |
| 6,946,367 B2 * | 9/2005 | Matsumura et al. | 438/471 |
| 7,256,423 B2 | 8/2007 | Yamaguchi et al. | |
| 2005/0034653 A1 * | 2/2005 | Im et al. | 117/84 |

FOREIGN PATENT DOCUMENTS

| JP | 2003-77834 | 3/2003 |
| JP | 2003-332350 | 11/2003 |

OTHER PUBLICATIONS

Voutsas et al., "Effect of process parameters on the structural characteristics of laterally grown, laser-annealed polycrystalline silicon films," Journal of Applied Physics, vol. 94, pp. 7445-7452, 2003.
Yamaguchi K., "Modeling and characterization of polycrystalline-silicon thin-film transistors with a channel-length comparable to a grain size," Journal of Applied Physics, vol. 89, pp. 590-595, 2001.
Kimura et al., "Extraction of Trap States at the Oxide-Silicon Interface and Grain Boundary for Polycrystalline Silicon Thin-Film Transistors," Jpn. J. Appl. Phys. vol. 40, Part I, No. 9A, Sep. 2001, pp, 5227-5236.
Kimura et al., "Device Simulation of Carrier Transport through Grain Boundaries in Lightly Doped Polysilicon Films and Dependence on Dopant Density," Jpn. J. Appl. Phys. vol. 40, Part I, No. 9A, Sep. 2001, pp. 5237-5243.

* cited by examiner

*Primary Examiner* — Jay C Kim
(74) *Attorney, Agent, or Firm* — K&L Gates LLP

(57) ABSTRACT

A thin film semiconductor device is provided. The semiconductor device includes a semiconductor thin film configured to have an active region turned into a polycrystalline region through irradiation with an energy beam, and a gate electrode configured to be provided to traverse the active region. Successive crystal grain boundaries extend along the gate electrode in a channel part that is the active region overlapping with the gate electrode, and the crystal grain boundaries traverse the channel part and are provided cyclically in a channel length direction.

5 Claims, 8 Drawing Sheets

THIN FILM SEMICONDUCTOR DEVICE HAVING CRYSTAL GRAIN BOUNDARIES CYCLICALLY TRAVERSING A CHANNEL PART AND METHOD FOR MANUFACTURING SAME

CROSS REFERENCES TO RELATED APPLICATIONS

The present application claims priority to Japanese Patent Application JP 2006-347052 filed in the Japanese Patent Office on Dec. 25, 2006 and Japanese Patent Application JP 2006-067272 filed in the Japanese Patent Office on Mar. 13, 2006, the entire contents of which are being incorporated herein by reference.

BACKGROUND

The present disclosure relates to a thin film semiconductor device and a method for manufacturing the same, and particularly to a thin film semiconductor device that includes plural elements obtained by crystallizing a semiconductor thin film through irradiation with an energy beam, and a method for manufacturing the same.

In a flat display such as a liquid crystal display, thin film transistors (TFTs) are employed as switching elements for active-matrix display of plural pixels. The kinds of TFT include a TFT having an active region composed of polycrystalline silicon (poly-Si) (poly-Si TFT) and a TFT having an active region composed of non-crystalline silicon (amorphous Si) (a-Si TFT).

Compared with the a-Si TFT, the poly-Si TFT has carrier mobility higher by a factor of about 10 to 100 times, and a smaller degree of deterioration of the on-state current. It follows that the poly-Si TFT has superior characteristics as a switching element.

As a fabrication technique for the poly-Si TFT, there has been developed a so-called low-temperature poly-Si process, in which an amorphous silicon film is turned into a polycrystalline film by using only low-temperature processes at temperatures below about 600° C., for achievement of reduced substrate cost. For example, in a low-temperature poly-Si process employing an excimer laser, an amorphous silicon film is irradiated with pulses of laser light shaped into a line beam. In this irradiation, the irradiation position is so slightly shifted at every pulse irradiation that most parts of adjacent irradiated regions overlap with each other and the same position on the film is irradiated with the laser light pulse 10 to 20 times. This process results in achievement of a polycrystalline film having a crystal grain size uniformed across the entire active region.

As another example of the low-temperature poly-Si process, there has been proposed a method in which a crystallized region is formed by irradiating an amorphous silicon film with continuous laser light obtained from e.g. a harmonic of a YAG laser. During the irradiation, the laser light is moved at a constant speed so that the irradiation energy is equalized. After the forming of the crystallized region, patterning is so carried out that a region free from a crystal grain boundary is used as the active region of a thin film transistor (refer to Japanese Patent Laid-open No. 2003-77834 (in particular, paragraphs 0091, 0092 and 0169)).

Furthermore, sequential lateral solidification (SLS) has been proposed by Columbia University and so forth as a method in which the width of lateral growth of a crystal is defined by multi-step irradiation with use of a mask (refer to A. T. Vouysas, A. Limnov, and J. S. In, "Journal of Applied Physics" (2003), Vol. 94, P. 7445 to 7452).

In recent years, flat panel displays as mentioned above, liquid crystal displays allowing a high frame rate are being developed for further enhancement in moving image properties and contrast properties. In addition, novel displays such as self-luminous displays typified by organic EL displays are also being developed. Along with these developments, there has been an increasing demand for TFTs that suffer no characteristic deterioration even when large current is suddenly applied thereto, and of which characteristic variation is small, as switching elements applicable to these displays.

However, poly-Si TFTs obtained through the above-described existing low-temperature poly-Si process problematically involve larger variation in characteristics among elements, specifically, larger variation in the initial threshold voltage and on-state current in particular, compared with a-Si TFTs, although the poly-Si TFTs have great advantages such as ease of application of comparatively large current thereto, higher carrier mobility, and smaller characteristic deterioration.

In order to reduce this variation, it has been attempted in the above-described crystallization employing an excimer laser to minimize variation among elements by forming a film in which similar crystals with a crystal grain size of about 300 nm, equivalent to the wavelength of the laser light, have been grown. However, even using such a polycrystallized film was not enough to offer a sufficient effect of suppressing the characteristic variation among elements.

This is because in crystallization by a method in related art which employs an excimer laser annealing apparatus, it is difficult to control the size of crystal grains in a poly-Si film with high accuracy and hence uneven crystal grain size is obtained. The crystal grain size unevenness leads to variation in the number of crystal grain boundaries in a channel region among TFTs, which results in variation in characteristics of the TFTs (refer to e.g. K. Yamaguchi; et al; J. Appl. Phys., Vol. 89, No. 1, pp. 590, and M. Kimura et al; JAP. J. APPL. PHYSI. Vol. 40 Part 1 (2001), No. 1). In a display including organic EL elements as its display elements in particular, this problem is important because the variation appears as color unevenness and so on in the display part.

It is difficult even for the low-temperature poly-Si process described in Japanese Patent Laid-open No. 2003-77834 (in particular, paragraphs 0091, 0092 and 0169) to sufficiently suppress the variation in characteristics of TFTs. This would be because each crystal region inside a channel region becomes large and therefore influence dependent upon the presence or absence of defects, dislocations and so on inside a crystal is greatly reflected in the characteristic variation. Furthermore, FIG. 8 in A. T. Vouysas, A. Limnov, and J. S. Im, "Journal of Applied Physics" (2003), Vol. 94, P. 7445 to 7452 shows that TFTs formed by the SLS method involves mobility variation larger than 10% even when the TFTs have been formed through the optimum process. This would be due to the existence of a myriad of uncontrolled crystal grain boundaries in a crystal region in a laterally grown part.

SUMMARY

According to an embodiment, it is desirable to provide a thin film semiconductor device in which transistor characteristics are controlled with high accuracy while small changes of the transistor characteristics over time and high carrier mobility are ensured, and to provide a method for manufacturing such a thin film semiconductor device.

According to an embodiment, there is provided a thin film semiconductor device that includes a semiconductor thin film configured to have an active region turned into a polycrystalline region through irradiation with an energy beam, and a gate electrode configured to be provided to traverse the active region. Furthermore, successive crystal grain boundaries extend along the gate electrode in a channel part that is the active region overlapping with the gate electrode. The crystal grain boundaries traverse the channel part and are provided cyclically in the channel length direction.

In the thin film semiconductor device with such a configuration, carriers that are to pass the channel part necessarily traverse the cyclically provided crystal grain boundaries. Therefore, regulating the cycle of the crystal grain boundaries allows transistor characteristics (carrier mobility) of the thin film semiconductor device to be controlled with high accuracy. For example, by equalizing the magnitude of the cycle or the number of cycles (the number of crystal grain boundaries) disposed in the channel part, variation in carrier mobility among plural elements can be suppressed. Furthermore, it has been confirmed that in such a configuration, setting the crystalline state in each cycle to a predetermined state allows suppression of deterioration of element characteristics and maintenance of high carrier mobility, which is an advantage of an element employing a semiconductor thin film turned into a polycrystalline film.

According to another embodiment, there is provided a method for manufacturing the thin film semiconductor device having the above-described configuration.

According to the embodiments, it is possible to achieve a thin film semiconductor device in which carrier mobility is controlled with high accuracy while small changes of element characteristics over time and high carrier mobility are ensured because of polycrystallization of the channel part. In this thin film semiconductor device, element characteristics are favorable and variation in the characteristics among the elements is small. Therefore, the performance of a display employing this thin film semiconductor device as its switching elements is high.

Additional features and advantages are described herein, and will be apparent from, the following Detailed Description and the figures.

DETAILED DESCRIPTION

Embodiments are described in detail below with reference to the accompanying drawings. In the following, initially a description will be made on a thin film semiconductor device, as an example of the embodiment, that includes plural top-gate poly-Si TFTs formed on the same substrate as switching elements for pixels in a display, followed by description of a manufacturing method thereof.

<Thin Film Semiconductor Device>

Figure 1A:
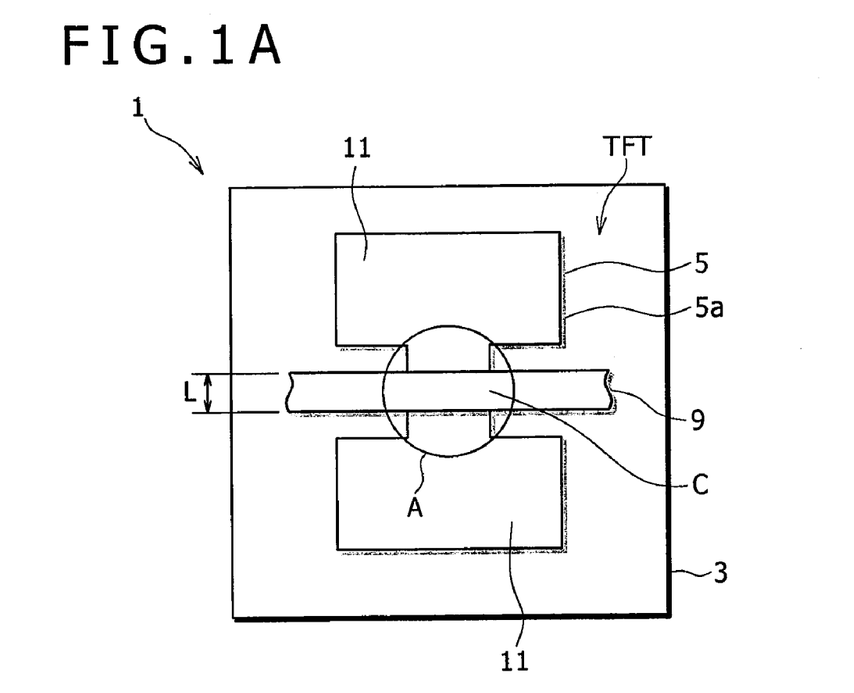
FIGS. 1A and 1B are plan views showing the configuration of a thin film semiconductor device according to an embodiment.
Figure 1B:
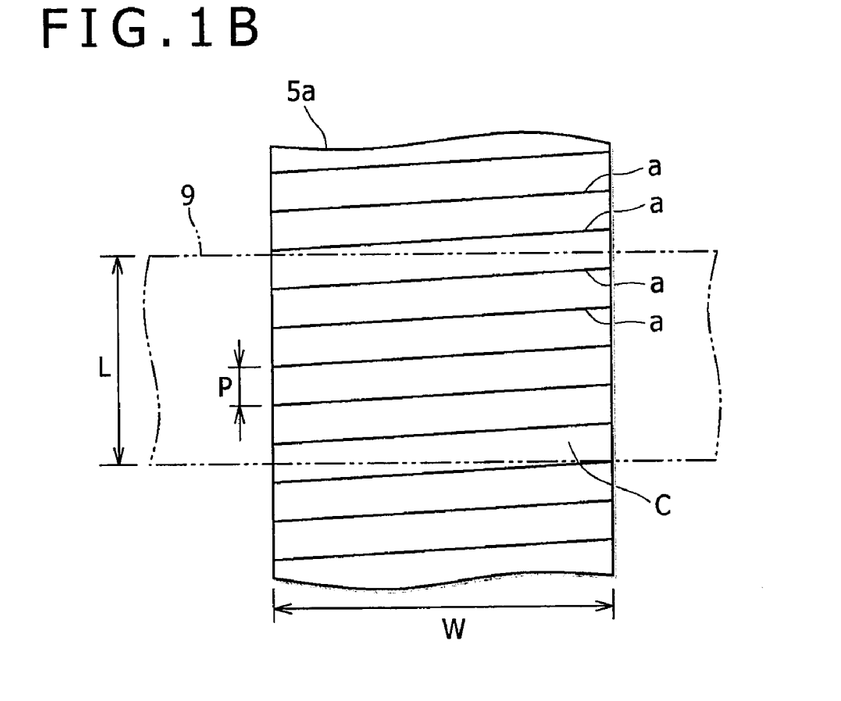

FIG. 1A is a plan view showing the configuration of the thin film semiconductor device according to the embodiment. FIG. 1B is a plan view showing part A in FIG. 1A in a magnified form. In a thin film semiconductor device 1 shown in these drawings, plural thin film transistors TFT are provided on the same substrate 3. Note that only one thin film transistor TFT is illustrated in the drawings.

Each thin film transistor TFT includes an active region 5a formed of a semiconductor thin film 5 and a gate electrode 9 that is provided in such a manner as to traverse the center part of the active region 5a.

The active region 5a formed of the semiconductor thin film 5 is a region turned into a polycrystalline region through irradiation of the semiconductor thin film 5 deposited as an amorphous silicon film with an energy beam such as laser light. The semiconductor thin film 5 is patterned into an island shape including the active region 5a. The semiconductor thin film 5 may be so patterned that no amorphous semiconductor thin film 5 is left around the crystallized active region 5a as shown in the drawing. Alternatively, the amorphous semiconductor thin film 5 may be left around the active region 5a.

The part of the active region 5a overlapping with the gate electrode 9 serves as a channel part C. The partial regions of the active region 5a on both the sides of the channel part C serve as source/drain 11.

In the present embodiment, each of the thin film transistors TFT with the above-described structure is characterized in the crystalline state in the active region 5a and the arrangement manner of the gate electrode 9 with respect to the crystalline state.

Specifically, at least in the channel part C overlapping with the gate electrode 9 in each active region Sa, plural successive crystal grain boundaries a are provided along the extension direction of the gate electrode 9 in such a manner as to traverse the channel part C. These crystal grain boundaries a are provided cyclically with a certain pitch P across the channel length L.

The crystalline state between the crystal grain boundaries a-a is almost the same along the extension direction of the gate electrode 9. This part including the cyclically arranged crystal grain boundaries a may range in the channel part C or may also range in the entire active region 5a.

In the present embodiment, the crystal grain boundaries a are cyclically arranged in the entire active region 5a including the channel part C, and no amorphous semiconductor thin film 5 is left around the active region 5a.

The above-described successive crystal grain boundaries a arise from parallel scanning of an energy beam with a predetermined pitch and are parallel to the scanning direction for example, as described later in detail in explanation of a manufacturing method.

The line width of the gate electrode 9 (i.e., the channel length L) is designed based on the standards of the thin film transistor including the gate electrode 9, and so defined that a predetermined number of crystal grain boundaries a are provided under the gate electrode 9 in such a manner as to traverse the channel part C across the channel width W. Furthermore, it is important that the number of crystal grain boundaries a provided in the channel part C is almost the same in thin film transistors having equivalent characteristics. Preferably, "almost the same number" encompasses only an error of ±1 from a predetermined number.

As variation in the ratio of the actual number of crystal grain boundaries a provided in the channel part C to a predetermined number is smaller, more uniform characteristics of the thin film transistors can be achieved. Therefore, the number of crystal grain boundaries a provided in the channel part C should be two or more, and a larger number is more preferable. Specifically, also as described later, it is preferable that the pitch P be so defined depending on the channel length that the number of crystal grain boundaries a extending in the channel width direction is about 25. However, a larger number of crystal grain boundaries a that intersect with the direction of the channel length L in the channel part C yields lower carrier mobility in the direction of the channel length L. Therefore, the number of crystal grain boundaries a should be set to a value that allows keeping of somewhat high carrier mobility, although a larger number is more preferable.

Furthermore, in order to stabilize the number of crystal grain boundaries a disposed in the channel part C, the plural crystal grain boundaries a are disposed in parallel to each other and the cycle P thereof is kept constant at least in the channel part C in the active region 5a.

Figure 2:
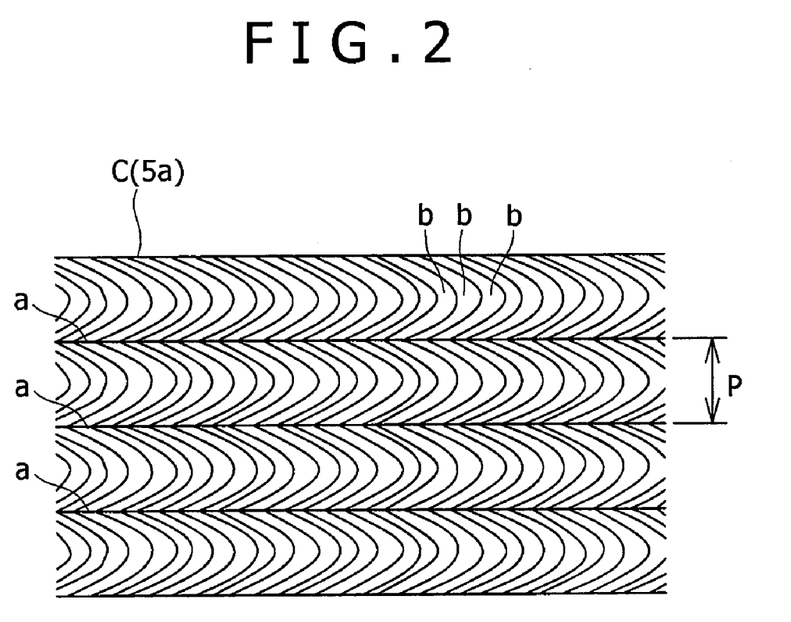
FIG. 2 is a plan view showing magnified major part of a thin film semiconductor device according to an embodiment.

FIG. 2 is a plan view showing one example of the channel part C in more detail in a magnified form. As shown in FIG. 2, it is preferable that in the channel part C (active region 5a) in which the crystal grain boundaries a are provided as described above, crystal grains b each having a crescent shape convex in the extension direction of the crystal grain boundaries a be arranged between the crystal grain boundaries a. These crystal grains b range from one crystal grain boundary a to the adjacent crystal grain boundary a, and are arranged along the extension direction of the crystal grain boundaries a.

The forming of the active region 5a including the crystal grain boundaries a and the crystal grains b will be explained in detail in the following description of a manufacturing method.

<Method for Manufacturing Thin Film Semiconductor Device>

Based on FIGS. 3A to 3D, a method for manufacturing the thin film semiconductor device 1 having the structure shown in FIGS. 1A, 1B and 2 will be described below, also with reference to other drawings.

Figure 3A:
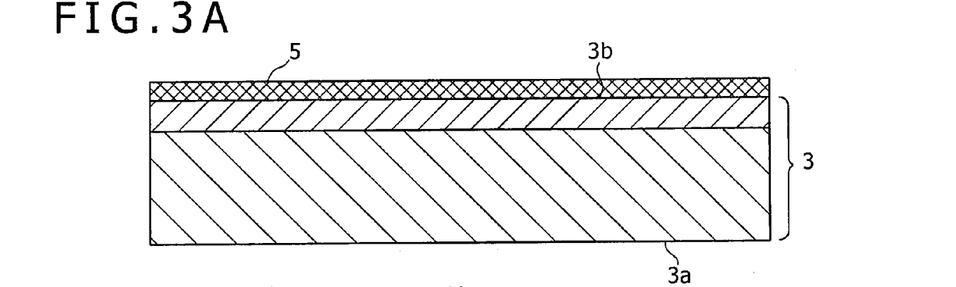
FIGS. 3A to 3D are sectional views for explaining steps in a method for manufacturing a thin film semiconductor device according to an embodiment.

Initially, as shown in FIG. 3A, a substrate 3a over which a thin film semiconductor device is to be formed is prepared. As the substrate 3a, any of amorphous substrates such as a glass substrate, quartz substrate, sapphire substrate, and plastic substrate, and metal substrates such as an aluminum substrate and stainless-steel substrate is used.

On one major surface of the substrate 3a, an insulating buffer layer 3b for preventing thermal conduction to the substrate 3a is provided. As the buffer layer 3b, any of a silicon oxide film, silicon nitride film, silicon carbide film, and other oxide films composed of oxides of Ti, Al, Zr, Hf, and so on may be used. The buffer layer 3b can be formed by a publicly-known vacuum deposition technique such as CVD, sputtering, or evaporation. Alternatively, an insulating layer generally used as an interlayer insulating film and so on, such as an inorganic SOG film or organic SOG film, may be used as the buffer layer. More alternatively, a dielectric film formed through anodic oxidation of a metal film, or a film deposited by a publicly-known technique such as a sol-gel method or metal organic deposition (MOD) may be used.

Subsequently to the deposition of the buffer layer 3b, the amorphous semiconductor thin film 5 is formed over the one main surface of the substrate 3, of which surface has been covered by the buffer layer 3b. In this example, the semiconductor thin film 5 composed of amorphous silicon is formed by plasma enhancement-chemical vapor deposition (PE-CVD) as one example. The thus obtained semiconductor thin film 5 is composed of so-called hydrogenated amorphous silicon (a-Si:H) containing a large amount of hydrogen. The film thickness of the semiconductor thin film 5 is in the range of e.g. 20 nm to 100 nm.

The forming method of the semiconductor thin film 5 is not limited to PE-CVD but a coating method may be used as long as the deposition temperature in the method is low. In a coating method, a mixture of a polysilane compound and a solvent is applied over the substrate 3, and then drying and annealing are carried out to thereby form the semiconductor thin film 5. The use of a deposition method allowing a low deposition temperature, such as PE-CVD or the above-described coating method, provides the semiconductor thin film 5 composed of hydrogenated amorphous silicon (a-Si:H) containing hydrogen of about 0.5 atoms % to 15 atoms %. In any method, this atomic percentage range varies to some extent depending on deposition conditions.

Subsequently to the deposition of the semiconductor thin film 5, so-called dehydrogenation annealing is carried out according to need for desorption of excess hydrogen ions in the semiconductor thin film 5. As the dehydrogenation annealing, e.g. furnace annealing at a temperature of 400° C. to 600° C. is carried out. This dehydrogenation annealing may be omitted if the subsequent crystallization annealing is carried out in such a way that the irradiation energy is so regulated that the excess hydrogen is removed from the part irradiated with laser light without gasification and accompanying expansion of the hydrogen ions in the semiconductor thin film 5.

Figure 3B:
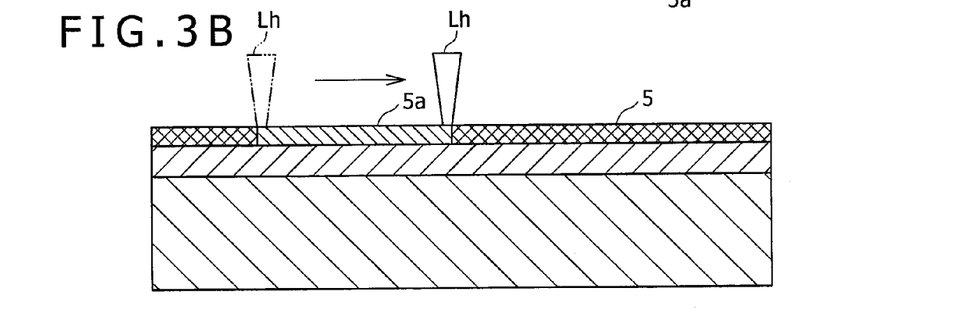

After the above-described step, as shown in FIG. 3B, a crystallization step is carried out to crystallize the active region 5a defined in the semiconductor thin film 5 through irradiation of the semiconductor thin film 5 with laser light Lh as an energy beam.

During the irradiation in this crystallization step, the laser light Lh is moved for scanning in a predetermined direction at a predetermined speed relative to the semiconductor thin film 5.

Figure 4:
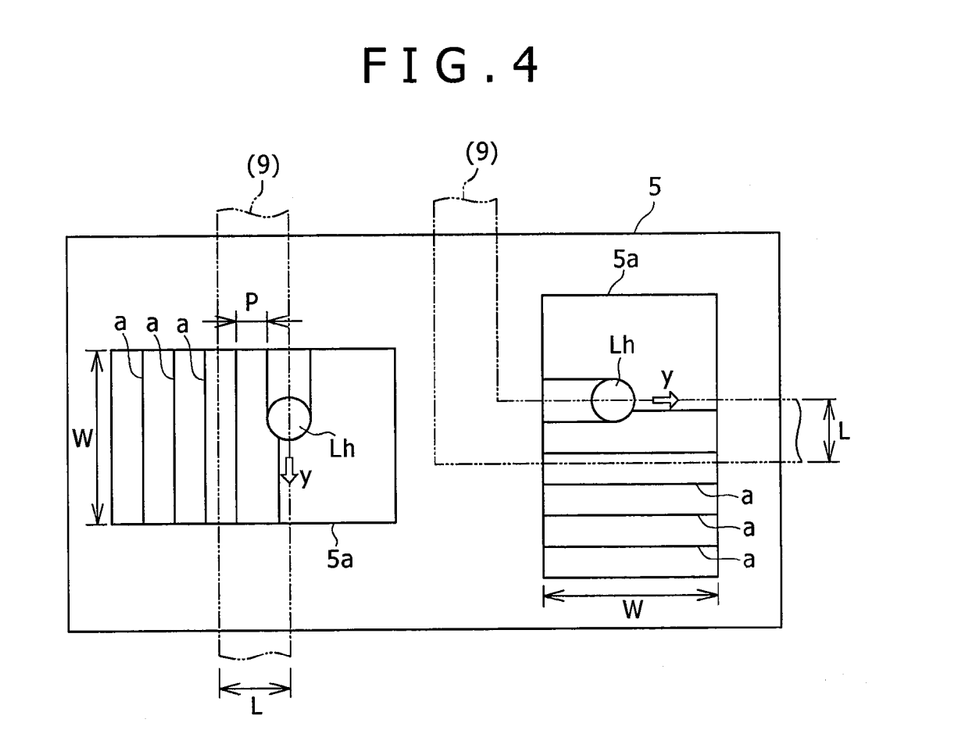
FIG. 4 is a plan view for explaining a crystallization step in a method for manufacturing a thin film semiconductor device according to an embodiment.

Specifically, as shown in FIG. 4, the irradiation position of the laser light Lh is shifted with a predetermined pitch in the width direction of the gate electrode (9) to be formed subsequently (i.e., the direction of the channel length L), so that the laser light Lh is moved for scanning in a predetermined scanning direction y to trace the shifted irradiation position. The scanning direction y of the laser light Lh is set identical to a direction that is almost the same as the extension direction of the gate electrode (9), i.e., to the direction of the channel width W. Thus, in each active region 5a, the irradiation position of the laser light Lh is shifted in the direction dependent upon the extension direction of the gate electrode (9), so that the laser light Lh is moved for scanning in the predetermined scanning direction y to trace the shifted irradiation position.

Furthermore, in the crystallization step, the irradiation amount, irradiation spot diameter, and scanning speed of the laser light Lh, the shift pitch of the irradiation position, and other parameters are so defined that the successive crystal grain boundaries a parallel to the scanning direction y of the laser light Lh will appear with a predetermined cycle P.

Figure 5A:
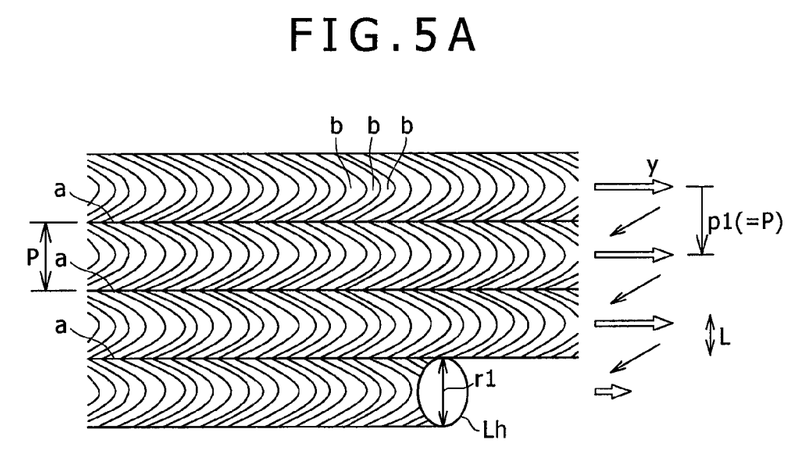
FIGS. 5A and 5B are plan views for explaining details of a crystallization step in a method for manufacturing a thin film semiconductor device according to an embodiment.

As an example of the method for the crystallization step, a method employing explosive crystallization like that shown in FIG. 5A is available. To cause the explosive crystallization through irradiation with the laser light Lh, conditions of the irradiation with the laser light Lh, such as the irradiated-region size, irradiation speed, and irradiation energy, are so controlled that during the scanning of the laser light Lh, complete melting of the semiconductor thin film 5 in the irradiated region is preceded by thermal conduction from the irradiated region to the peripheral region. A2

As the wavelength of the laser light Lh incident on the semiconductor thin film 5, based on the film thickness and absorption coefficient of the semiconductor thin film 5, a wavelength offering a comparatively small absorption coefficient is selected so that the laser light Lh may not pass the semiconductor thin film 5 but be absorbed therein without loss. Specifically, for e.g. the semiconductor thin film 5 composed of amorphous silicon having a thickness of 50 nm, laser light with a wavelength of 350 nm to 470 nm is preferably used. As the oscillation source of the laser light Lh with such a wavelength, e.g. a GaN-based compound semiconductor laser oscillator or a YAG laser oscillator is available. Furthermore, the explosive crystallization of the semiconductor thin film 5 can be caused also by adjusting irradiation conditions other than the wavelength of the laser light Lh, such as the numerical aperture NA of the objective lens that emits the laser light Lh, and the scanning speed and irradiation energy of the laser light Lh.

Across each irradiation position arising from the shift of the laser light Lh with a predetermined shift pitch p1 in the direction of the channel length L, the laser light Lh is moved for scanning in the scanning direction y substantially perpendicular to the direction of the channel length L with the above-described irradiation conditions. In this irradiation, the spot diameter r1 of the laser light Lh is so adjusted depending on the shift pitch p1 that no amorphous region is left and the successive crystal grain boundary a parallel to the scanning direction y is generated between the adjacent irradiation positions of the laser light Lh.

Due to this, polycrystallization of the semiconductor thin film 5 proceeds in such a way that the crystal grain boundaries a are provided with the cycle P having the same width as the shift pitch pl. Furthermore, between the crystal grain boundaries a-a, the crystal grains b each having a crescent shape convex in the scanning direction y of the laser light Lh are arranged along the extension direction of the crystal grain boundaries a.

The spot diameter r1 of the laser light Lh and the shift pitch p1 of the irradiation position of the laser light Lh (the cycle P of the crystal grain boundaries a) are important factors in defining the number (the cycle) of crystal grain boundaries a provided in the channel part. As described above in the explanation of the device structure, the number (the cycle) of crystal grain boundaries a provided in the channel part is set to a large value that allows uniformed transistor characteristics without lowering of carrier mobility. In addition, the shift pitch p1 (the cycle P of the crystal grain boundaries a) is so defined that a larger number of crystal grain boundaries a are provided in the channel part without excess over the process tact time. Furthermore, depending on the shift pitch p1, the spot diameter r1 of the laser light Lh is so defined that the successive crystal grain boundaries a are generated without a remaining amorphous region.

Assuming that the channel length (the line width of the gate electrode) of a typical thin film transistor is at most 10 µm, it is preferable that the number of crystal grain boundaries a disposed in the channel part C be about 25, also in consideration of the productivity. In this case, the shift pitch p1 (the cycle P of the crystal grain boundaries a) of the irradiation position of the laser light Lh is set to about 400 nm. Furthermore, the spot diameter r1 is set almost equivalent to the shift pitch p1 (the cycle P of the crystal grain boundaries a). Specifically, the spot diameter r1 is set to a value in the range of 1 nm to 10 µm, and to several hundred nanometers in this case, so that the successive crystal grain boundaries a parallel to the scanning direction y are generated between the adjacent irradiation positions of the laser light Lh. Note that the spot diameter r1 is in a range not exceeding the channel length L.

Figure 5B:
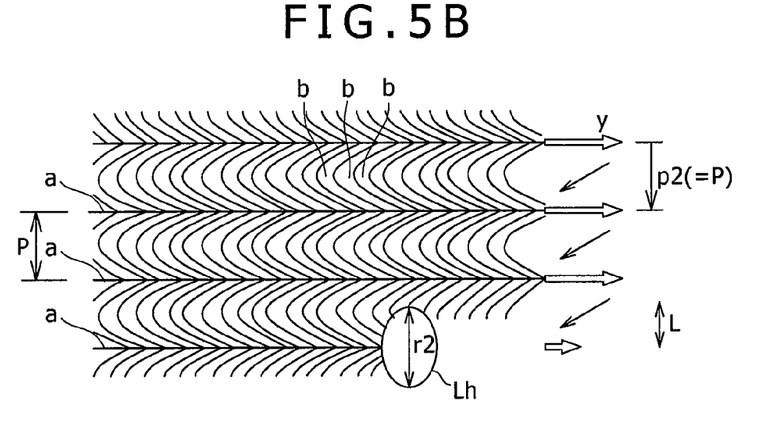

Instead of employing the above-described explosive crystallization, this crystallization step may be so carried out that as shown in FIG. 5B, the successive crystal grain boundary a parallel to the scanning direction y is generated at the center of the irradiation spot of the laser light Lh. In order to generate the crystal grain boundaries a at such positions through the irradiation with the laser light Lh, the laser light Lh is moved for scanning in such a way that the semiconductor thin film 5 is completely melted across the entire depth thereof in each laser irradiation position.

For the complete melting of the semiconductor thin film 5 across the depth thereof, irradiation conditions such as the wavelength of the laser light Lh, the numerical aperture NA of the objective lens that emits the laser light Lh, and the scanning speed and irradiation energy of the laser light Lh are adjusted based on the film thickness and absorption coefficient of the semiconductor thin film 5. Similarly to the explosive crystallization described with FIG. 5A, the crystallization shown in FIG. 5B can also employ the laser light Lh having a wavelength of 350 nm to 470 nm, emitted from a GaN-based compound semiconductor laser oscillator or YAG laser oscillator. In this crystallization, the semiconductor thin film 5 is completely melted across the depth thereof through adjustment of the above-described irradiation conditions.

In this irradiation, across each irradiation position arising from the shift of the laser light Lh with a predetermined shift pitch p2 in the direction of the channel length L, the laser light Lh is moved for scanning in the scanning direction y (the extension direction of the gate electrode) substantially perpendicular to the direction of the channel length L. Furthermore, the spot diameter r2 (in the direction of the channel length L) of the laser light Lh is so adjusted depending on the shift pitch p2 of the laser light Lh that no amorphous region is left and the successive crystal grain boundary a parallel to the scanning direction y is generated between the adjacent irradiation positions of the laser light Lh.

Due to this, polycrystallization of the semiconductor thin film 5 proceeds in such a way that the crystal grain boundaries a are provided with the cycle P having the same width as the shift pitch p2. Furthermore, between the crystal grain boundaries a-a, the crystal grains b each having a crescent shape convex in the opposite direction of the scanning direction y of the laser light Lh are arranged along the extension direction of the crystal grain boundaries a. This crystallization step can offer a favorable crystal quality and hence enhanced carrier mobility because the crystal grains b are obtained through complete melting of the semiconductor thin film 5 by irradiation with the laser light Lh and subsequent recrystallization through liquid-phase growth.

Also in this crystallization, the spot diameter r2 of the laser light Lh and the shift pitch p2 of the irradiation position of the laser light Lh (the cycle P of the crystal grain boundaries a) are so defined that a larger number of crystal grain boundaries a are provided in the channel part without excess over the process tact time, similarly to the explosive crystallization described with FIG. 5A.

In the above-described respective crystallization steps described with FIGS. 5A and 5B, it is desirable that the characteristics of the crystal grain boundaries a formed through irradiation with the laser light Lh are kept constant. As factors in keeping the characteristics of the crystal grain boundaries a constant, the following conditions should be satisfied: the laser irradiation energy density is constant across each irradiation position; the scanning speed is constant; the shift pitches p1 and p2 of the irradiation position are constant (the cycle P is constant); and the film thickness of the semiconductor thin film 5 is uniform.

To obtain a constant density of the irradiation energy of the laser light Lh, it is desirable that the laser light Lh be continuously oscillated at least during irradiation of the active region 5a with the laser light Lh. The "continuous oscillation" encompasses also an oscillation pause that does not lead to a decrease in the temperature of the semiconductor thin film 5 (e.g., a pause of 50 ns or shorter). In addition, to carry out the above-described irradiation with a constant density of the irradiation energy of the laser light Lh, it is desirable to use a laser light irradiation apparatus equipped with an energy feedback function and a focus servo function. The energy feedback function and focus servo function can be implemented by a publicly-known technique used in e.g. a cutting machine for optical discs.

The irradiation of the semiconductor thin film 5 with the laser light Lh is carried out in such a way that the scanning speed of the laser irradiation is kept constant.

The shift of the irradiation position of the laser light may be relative to the semiconductor thin film; the substrate over which the semiconductor thin film has been formed may be shifted relative to the fixed irradiation position, or alternatively the irradiation position may be shifted relative to the fixed substrate. More alternatively, both the substrate 3 and the irradiation position may be moved.

Furthermore, the parallel scanning of the laser light Lh in the above-described respective crystallization steps described with FIGS. 5A and 5B may be sequentially carried out with use of one laser oscillator, or alternatively may be collectively carried out with use of plural laser oscillators. In fabrication of thin film transistors for driving a display, it is preferable that the plural active regions 5a be simultaneously irradiated. Specifically, when the productivity is taken into consideration, it is preferable that the plural active regions 5a arranged over a surface of the substrate 3 be simultaneously subjected to multipoint irradiation with the laser light Lh so that a crystallization step can be carried out for the plural active regions 5 a simultaneously.

To realize such multipoint irradiation with the laser light Lh, a semiconductor laser oscillator is preferably used as the oscillation source of the laser light. The semiconductor laser oscillator is greatly smaller in size than other laser oscillators such as excimer laser oscillators and YAG laser oscillators, which permits plural semiconductor laser oscillators to be disposed in one apparatus. Furthermore, the semiconductor laser oscillator can realize continuous irradiation with a rated output of 200 mW.

If the semiconductor laser oscillators are used, the number of semiconductor lasers can be increased in association with an increase in the substrate size. Hence, flexible apparatus design to address the substrate size increase is possible. Thus, a structure in which a large number of transistors having the same performance are arranged over a large-area substrate can be obtained. Therefore, using the semiconductor laser oscillators is advantageous, in forming of transistors having uniform characteristics over a large-area substrate, over a method of controlling crystal grain boundaries with use of a mask, reported at a research level.

Figure 3C:
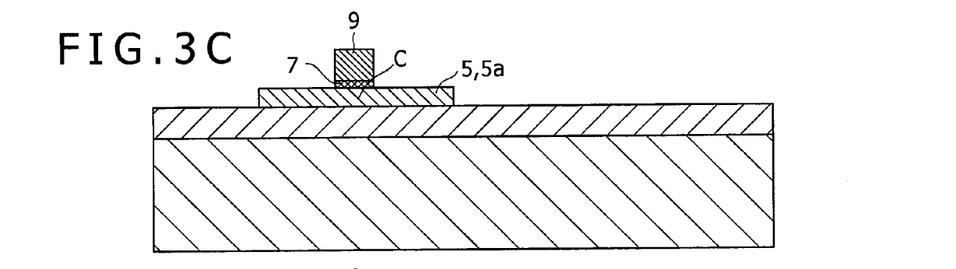

After the completion of the above-described crystallization step, as shown in FIG. 3C, the semiconductor thin film 5 is patterned by etching into a predetermined shape in which the crystallized active region 5a is left, so that the respective active regions 5a are shaped into an island for element isolation. The pattern-etching of the semiconductor thin film 5 may be so carried out that no non-crystallized semiconductor thin film 5 is left around the active region 5a as shown in the drawing. Alternatively, the non-crystallized semiconductor thin film 5 may be left around the active region 5a. This pattern-etching of the semiconductor thin film 5 may precede the above-described crystallization step. In this case, the crystallization step is carried out for each semiconductor thin film 5 patterned into an island including the region that is to serve as the active region 5a.

Subsequently to the pattern-etching, a gate insulating film 7 is formed above the substrate 3 to cover a part of the active region 5a resulting from the patterning. The gate insulating film 7 is formed of a silicon oxide or silicon nitride, and can be deposited by a known method based on general PE-CVD. Alternatively, a known SOG film may be deposited as an insulating layer arising from coating. The deposition of the gate insulating film 7 may precede the pattern-etching of the semiconductor thin film 5.

The deposition of the gate insulating film 7 is followed by forming of the gate electrode 9 thereon. The gate electrode 9 traverses the center of the active region 5a shaped into an island. Specifically, as described with FIG. 4, the gate electrode 9 is formed along the extension direction of the crystal grain boundaries a formed in the active region 5a. If elements having the same characteristics are to be formed, the gate electrodes 9 having the same line width are pattern-formed for the elements so that the same number of crystal grain boundaries a are disposed below the gate electrodes 9.

To form the gate electrode 9, initially an electrode material layer composed of e.g. aluminum is deposited by sputtering or evaporation, and then a resist pattern is formed on the electrode material layer by lithography. Thereafter, the electrode material layer is etched by using the resist pattern as the mask, so that the gate electrode 9 is pattern-formed.

The forming method of the gate electrode 9 is not limited to this procedure, but e.g. a printing method of applying metal fine particles may be employed. Continuously to the etching of the electrode material layer for the forming of the gate electrode 9, the gate insulating film 7 may also be etched.

Figure 3D:
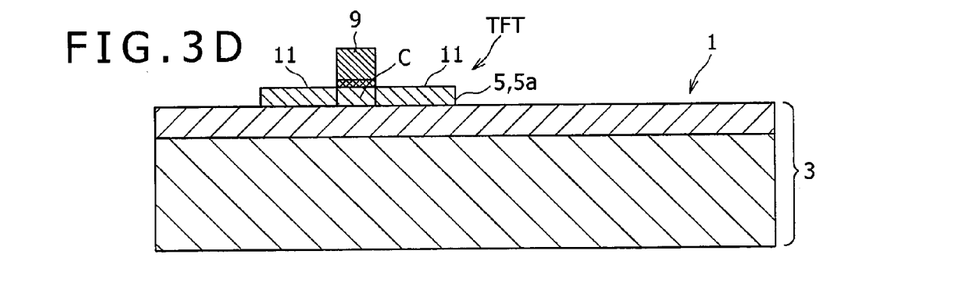

Subsequent to the forming of the gate electrode 9, as shown in FIG. 3D, the source/drain 11 are formed by introducing an impurity into the active region 5a in a self-aligned manner by using the gate electrode 9 as the mask. For this impurity introduction (e.g. ion-implantation with use of the gate electrode 9 as the mask) is carried out.

This impurity introduction forms the channel part C below the gate electrode 9. The channel part C corresponds to a region not doped with the impurity in the crystallized active region 5a. These source/drain 11 and the channel part C below the gate electrode 9 are composed of polycrystalline silicon obtained by crystallizing the semiconductor thin film 5. Therefore, the completion of the above-described steps results in achievement of the thin film semiconductor device 1 in which plural top-gate thin film transistors TFT (i.e., poly-Si TFTs) formed of a poly-Si thin film are provided over the same substrate 3.

Figure 6A:
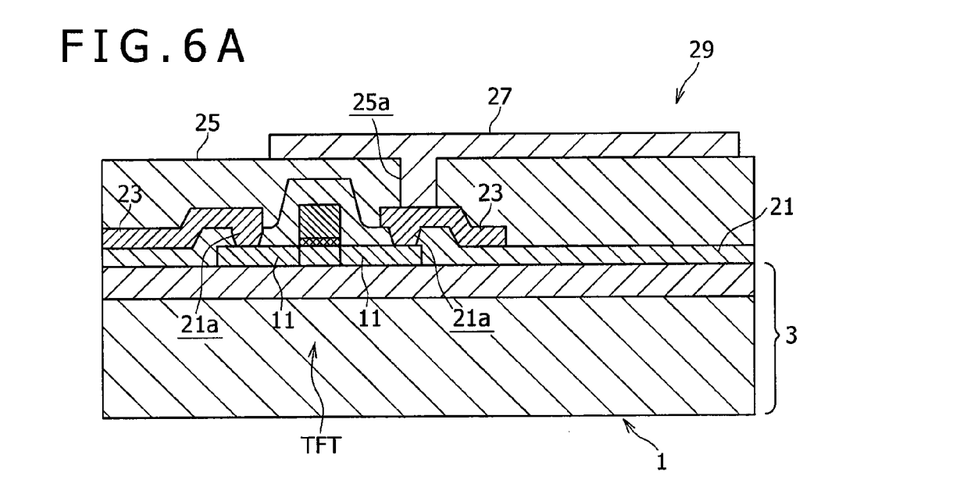
FIGS. 6A and 6B are diagrams showing manufacturing steps for a liquid crystal display employing a thin film semiconductor device according to an embodiment.

If, for example, a liquid crystal display is to be manufactured as a display employing such thin film transistors TFT as its switching elements, the following steps are further carried out.

Referring initially to FIG. 6A, over the substrate 3 of the thin film semiconductor device 1, an interlayer insulating film 21 is formed to cover the thin film transistor TFT. Subsequently, contact holes 21a that reach the source/drain 11 of the thin film transistor TFT are formed in the interlayer insulating film 21. Next, interconnects 23 coupled to the source/drain 11 via the contact holes 21a are formed on the interlayer insulating film 21.

Subsequently, a planarization insulating film 25 is formed to cover the interconnects 23, and a contact hole 25a that reaches the interconnect 23 is formed in the planarization insulating film 25. Next, a pixel electrode 27 connected to the source/drain 11 via the contact hole 25a and the interconnect 23 is formed on the planarization insulating film 25. The pixel electrode 27 is formed as a transparent electrode or reflective electrode depending on the displaying type of the liquid crystal display. Note that this drawing is a sectional view of major part of one pixel.

After the forming of the pixel electrode 27, an alignment layer (not shown) that covers the pixel electrode 27 is formed on the planarization insulating film, to thereby complete a drive substrate 29.

Figure 6B:
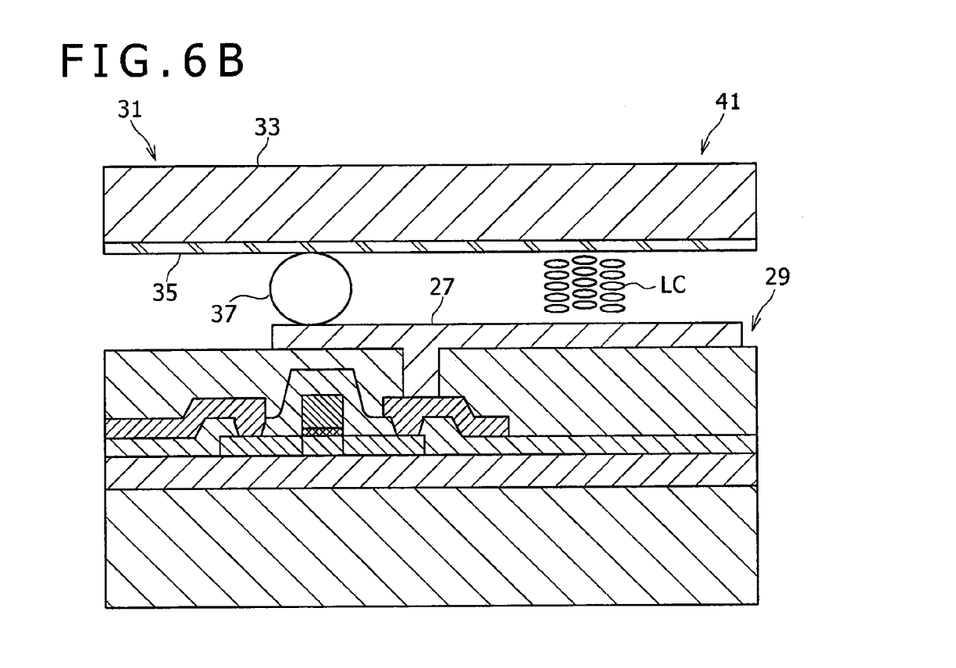

Furthermore, as shown in FIG. 6B, a counter substrate 31 that is to be disposed to face the drive substrate 29 is prepared. The counter substrate 31 is obtained by providing a common electrode 35 on a transparent substrate 33 and covering the common electrode 35 with an alignment layer (not shown). The common electrode 35 is formed of a transparent electrode.

The drive substrate 29 and the counter substrate 31 are disposed to face each other with intermediary of a spacer 37 therebetween in such a way that the pixel electrode 27 faces the common electrode 35. Subsequently, a liquid crystal LC is disposed and sealed between the substrates 29 and 31, separated by a predetermined gap by the spacer 37, so that a liquid crystal display 41 is completed.

If an organic EL display is to be manufactured by using the drive substrate 29 having the above-described configuration, the pixel electrode provided on the drive substrate 29 is used as an anode (or cathode), and organic layers with requisite functions such as a hole injection layer, luminescent layer, and electron transport layer are deposited over the pixel electrode. Furthermore, a common electrode is formed as a cathode (or anode) over the organic layers.

Referring to FIGS. 1A, 1B and 2, in the thin film semiconductor device 1 of the present embodiment, the crystal grain boundaries a provided along the gate electrode 9 traverse the channel part C and are disposed cyclically in the direction of the channel length L. Due to this structure, carriers that are to pass the channel part C necessarily traverse the cyclically disposed crystal grain boundaries a. Therefore, adjusting the cycle P of the crystal grain boundaries a can control transistor characteristics (carrier mobility) of the thin film transistors TFT in the thin film semiconductor device 1 with high accuracy. Specifically, by equalizing the cycle P and the number of crystal grain boundaries a disposed in the channel part C, variation in carrier mobility among plural elements can be suppressed.

In addition, the crystalline state between the crystal grain boundaries a-a is as follows: the crystal grains b each ranging between the crystal grain boundaries a-a are arranged along the crystal grain boundaries a. Therefore, no amorphous region is included between the crystal grain boundaries a-a, which suppresses deterioration of element characteristics. Furthermore, between the crystal grain boundaries a-a, carriers do not pass the crystal grain boundaries between the crystal grains b-b, and hence the carrier mobility in the direction of the channel length L is kept high.

Moreover, the cycle P of the crystal grain boundaries a can be favorably controlled by adjusting irradiation conditions of the laser light Lh as described above, which makes it possible to form the thin film transistors TFT of which transistor characteristics are controlled with high accuracy.

Consequently, a display having enhanced performance can be obtained by constructing the display with use of the thin film transistors TFT formed in such a thin film semiconductor device as switching elements for pixels. In an organic EL display in particular, color unevenness in the display part can be prevented.

In the above-described embodiment, as shown in FIG. 2, the crystalline state of the channel part C is as follows: between the crystal grain boundaries a, the crystal grains b having a crescent shape are arranged along the extension direction of the crystal grain boundaries a. However, the crystalline state of the channel part C is not limited to the structure in which the crystal grains b having a crescent shape are arranged between the crystal grain boundaries a, as long as the successive crystal grain boundaries a are disposed along the gate electrode cyclically in the direction of the channel length L in such a manner as to traverse the channel part C.

Figure 7:
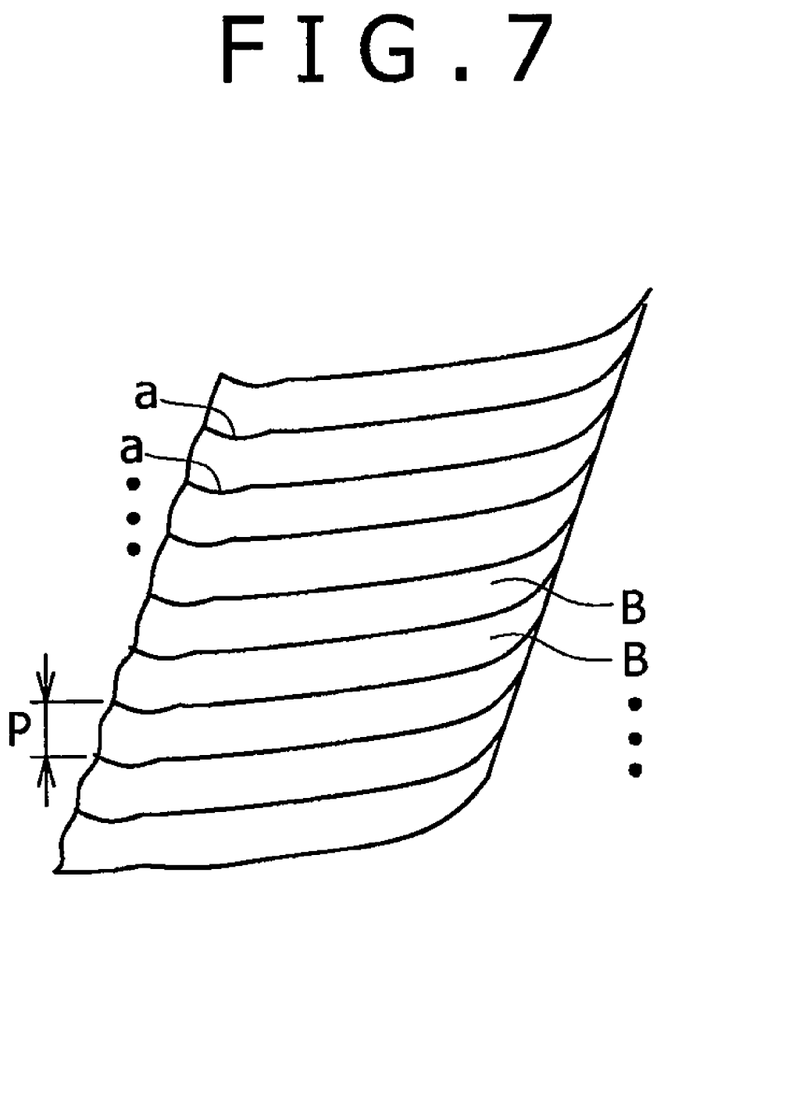
FIG. 7 is a plan view showing another example of the crystalline state of the channel part in a thin film semiconductor device according to an embodiment.

As an example of other crystalline states, the structure shown in FIG. 7 is available, in which the region between the crystal grain boundaries a is filled with a successive strip crystal grain B. Specifically, between the crystal grain boundaries a provided cyclically in the direction of the channel length L with a predetermined pitch P, the strip crystal grain B of which width is equal to the pitch P is provided along the extension direction of the crystal grain boundaries a.

The active region 5a including such crystal grain boundaries a and strip crystal grains B is formed by crystallization through irradiation of the active region with the laser light Lh in the following manner.

Figure 8A:
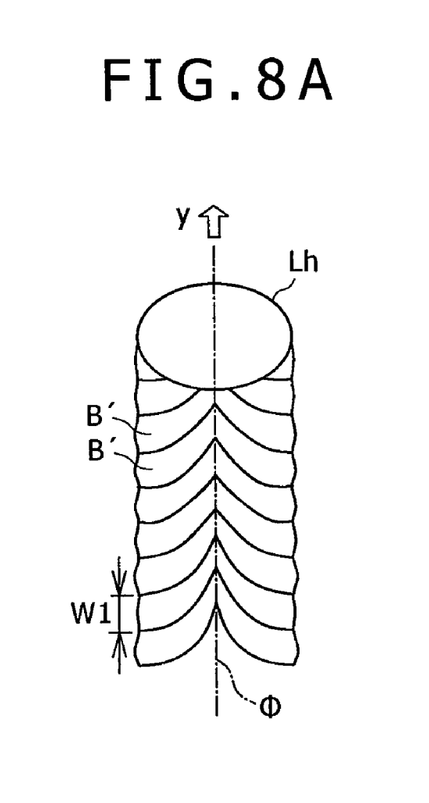
FIGS. 8A to 8C are plan views for explaining details of a crystallization step for obtaining the crystalline state of FIG. 7.

Referring initially to FIG. 8A, a semiconductor thin film is irradiated with the laser light Lh. During the irradiation, the laser light Lh is moved for scanning at a predetermined speed in a constant scanning direction y. In particular, similarly to the above-described embodiment, irradiation conditions of the laser light Lh are so defined depending on the film thickness of the semiconductor thin film that the semiconductor thin film is completely melted across the entire depth thereof due to the irradiation with the laser light Lh. Furthermore, in this crystallization step, it is preferable that the laser light Lh with a wavelength selected for this condition be used as a spot beam of which beam profile has the Gaussian shape.

At a scan path in which the semiconductor thin film has been completely melted due to the scanning of such a laser light Lh, solidification is advanced as the passage of the laser light Lh proceeds, so that crystal grains B' are arranged along the scan center φ of the laser light Lh. Because the laser light Lh is based on the Gaussian shape, the temperature distribution of the part irradiated with the laser light Lh is based on the Gaussian shape of the beam profile of the laser light Lh; the temperature is the highest at the scan center φ of the laser light Lh and the lowest at both the ends of the scan path. Therefore, when the semiconductor thin film is irradiated with the laser light Lh moved in the scanning direction y, at the scan path in which the semiconductor thin film has been completely melted, crystal solidification is initiated from positions remote from the scan center φ (from both the ends of the scan path), so that a certain number of crystal seeds are generated at both the ends of the scan path. Along with further advance of the scanning of the laser light Lh, the solidification proceeds in the scanning direction y toward the scan center φ in such a way that the crystal seeds B' are dragged in the scanning direction y toward the scan center φ, so that the scan center φ is crystallized last. In this laser irradiation, the scanning speed and output power of the laser light Lh may be further adjusted within the range of the above-described irradiation conditions so that the solidified regions meet with each other at the scan center φ. This further adjustment offers the crystal grains B' each having a half-crescent shape widen from the scan center φ toward an end of the scan path, i.e., a shape obtained by dividing a crescent by the symmetry line thereof.

Furthermore, the width W1 of the crystal grains B' in the scanning direction y of the laser light Lh is adjusted depending on the above-described irradiation conditions of the laser light Lh. The width W1 of the crystal grains B' in the scanning direction y is equivalent to the cycle of the crystal grain boundaries a (predetermined pitch P). Therefore, it is important that the above-described irradiation conditions of the laser light Lh, such as the wavelength of the laser light Lh, the numerical aperture NA of the objective lens that emits the laser light Lh, and the scanning speed and irradiation energy of the laser light Lh, are so defined that the crystal grains B' have the predetermined width W1=P and the semiconductor thin film is completely melted across the entire depth thereof due to the irradiation with the laser light Lh.

Figure 8B:
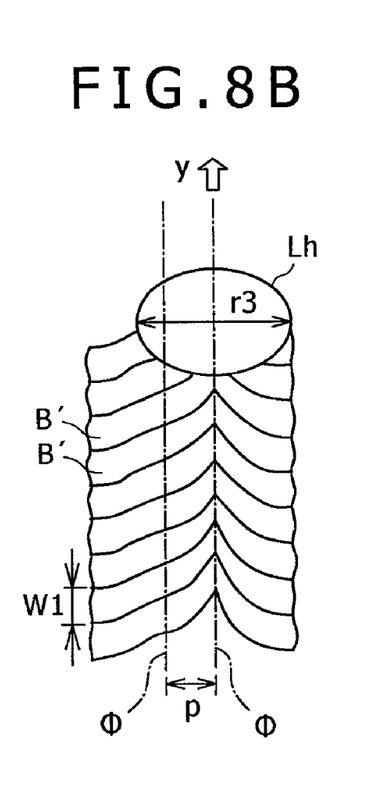

Subsequent to the first scanning, as shown in FIG. 8B, the second scanning of the laser light Lh is carried out, with the scan path shifted by a predetermined pitch p from the scan path of the first irradiation. In the second scanning, the scanning direction y of the laser light Lh is set to the constant direction parallel to the direction of the first scanning. The pitch p (the shift width of the scan path) of the parallel-scanning laser light Lh is set equal to or smaller than the diameter r3 of the laser light Lh (the irradiation diameter in the direction perpendicular to the scanning direction y). Due to this pitch setting, the solidification accompanying the second scanning of the laser light Lh proceeds in such a way that the crystallinity of the crystal grains B' formed in the first scan path of the laser light Lh is carried over into the second scan path. Thus, the crystal grains B' are grown in a direction different from the scanning direction y of the laser light Lh (direction substantially perpendicular to the scanning direction y).

It is preferable that the pitch p of the parallel-scanning laser light Lh be set equal to or smaller than the irradiation radius of the laser light Lh (r3/2). Such a pitch p makes it easier to keep the growth direction of the crystal grains B' at a constant direction. The reason therefor is as follows. As described above, if the laser light Lh based on the Gaussian shape is moved for scanning, solidification proceeds in the scanning direction y from both the ends of the scan path toward the scan center φ, which forms the crystal grains B' in line symmetry with respect to the scan center φ. Therefore, if the pitch p of the laser light Lh is set equal to or smaller than the irradiation radius of the laser light Lh (r3/2), melting and recrystallization are carried out in such a manner as to leave only part of the crystal grains B' resulting from advance of solidification in the scanning direction y from one end of the previous scan path toward the previous scan center φ. This makes it easier to keep the growth direction of the crystal grains B' at a constant direction. For example, if the crystal grains B' having a constant width W1 of several hundred nanometers are to be grown, the laser light Lh having a spot shape with an irradiation diameter r3 of 200 nm to 500 nm is moved for scanning, and the scan path is shifted by a small pitch p not exceeding the irradiation radius (r3/2).

Figure 8C:
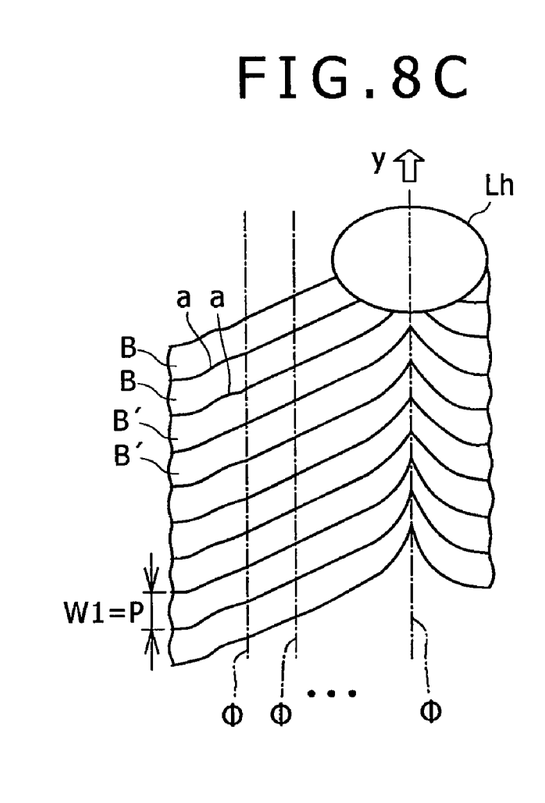

After the second scanning, as shown in FIG. 8C, the third scanning and the subsequent scanning of the laser light Lh are sequentially carried out in such a way that the scan path is shifted by the predetermined pitch p in every scanning. This further advances the growth of the crystal grains B' in the direction different from the scanning direction y of the laser light Lh, which forms the strip crystal grains B extending along the direction substantially perpendicular to the scanning direction y. If the scanning of the laser light Lh for each scan path is carried out with irradiation conditions similar to those of the first scanning, the width W1 of the strip crystal grains B in the scanning direction y is kept constant. The arrangement of such strip crystal grains B along the scanning direction y is equivalent to formation of a crystal region in which the crystal grain boundaries a are provided cyclically with the width W1 therebetween. That is, the crystal grain boundaries a are provided cyclically with a predetermined pitch P equal to the width W1 of the strip crystal grains B.

Similar to the above-described embodiment, the width W1 of the strip crystal grains B (i.e., the pitch P of the crystal grain boundaries a) is an important factor in defining the number of crystal grain boundaries a provided in the channel part in a thin film semiconductor device.

Besides the above-described crystallization method, as a procedure to carry out the crystallization due to which the region between the crystal grain boundaries a is filled with the successive strip crystal grain B as shown in FIG. 7, a method is available in which a semiconductor thin film is irradiated with pulses of laser light shaped into a line beam in such a way that the laser light is shifted by a pitch P in the minor axis direction of the line shape. In this method, only parts of the line shapes of the laser light are overlapped with each other in each irradiation, which allows the crystal grain boundaries a to be formed at the parts irradiated with the laser light redundantly. By setting the minor axis direction of the line shape to the direction of the channel length L, the crystal grain boundaries are provided cyclically in the direction of the channel length L. This method is equivalent to one example of the method set forth in a claim, in which the irradiation position of an energy beam is shifted in a predetermined shift direction by a predetermined pitch in such a way that each irradiated region partially overlaps with an adjacent irradiated region, to thereby provide a crystal grain boundary extending in a direction different from the shift direction through polycrystallization.

WORKING EXAMPLES

Working Examples 1 to 3 in accordance with an embodiment of the present invention will be described below based on FIGS. 3A to 3D and 5A and 5B, and then a comparative example is described.

Working Example 1

Plural thin film transistors were formed by employing the crystallization step described with FIG. 5A (see FIGS. 1A and 1B).

Specifically, initially the semiconductor thin film 5 composed of amorphous silicon was deposited to a film thickness of 50 nm by PE-CVD over the insulating substrate 3.

Subsequent, a crystallization step to irradiate each active region 5a of the semiconductor thin film 5 with the laser light Lh for polycrystallization thereof was carried out. A GaN laser was used as the laser light Lh, and the spot shape thereof was set to the following eclipse shape: the spot diameter r1 in the direction of the channel length L was 500 nm, and the spot diameter in the direction y perpendicular to the direction of the channel length L was 300 nm. The effective numerical aperture NA of an objective lens was 0.6. In the crystallization step for the semiconductor thin film 5, the shift pitch p1 in the direction of the channel length L was 400 nm, and the scanning speed vt in the scanning direction y perpendicular to the direction of the channel length L was 3 m/s. The irradiation energy at the substrate surface (plate-surface irradiation energy) was 17 mW. Focus servo was always performed on the irradiation of the semiconductor thin film 5 with the laser light Lh so that the focus was not deviated at the time of the high-speed scanning. Furthermore, a part of the emitted beam was monitored so that the irradiation energy was kept constant, to thereby prevent variation in the energy.

As a result of the crystallization step, the active region 5a became a polycrystalline region in which the plural crystal grain boundaries a were provided with a cycle P of 400 nm in the direction of the channel length L and the crystal grains b each ranging between the crystal grain boundaries a-a and each having a crescent shape convex in the scanning direction y were arranged along the crystal grain boundaries a. As the size of each crystal grain b, the maximum width thereof in the scanning direction y (the width of "belly part" of the crescent) was about 100 nm.

Subsequently to the crystallization step, each crystallized active region 5a was so patterned that the length thereof in the direction substantially parallel to the crystal grain boundaries a (i.e., the channel width W) was set to 50 μm. Thereafter, the gate insulating film 7 was deposited to cover the patterned active region 5a, and then the gate electrode 9 was formed over the gate insulating film 7 along the extension direction of the crystal grain boundaries a. The line width of the gate electrode 9 (i.e., the channel length L) was 20 μm. Therefore, the number of the crystal grain boundaries a that were provided under the gate electrode 9 to traverse the active region 5a was 50.

Thereafter, the source/drain 11 were formed in the active region 5a on both the sides of the gate electrode 9, so that the plural thin film transistors TFT having the same standards were formed over the substrate 3.

The on-state current of each of the obtained thin film transistors TFT was measured. As a result of the measurement, the variation ±σ in the on-state current was as small as ±1.5% (refer to Table 1 shown below). The variation in the threshold voltage Vth was also as small as 0.06 V. These results show that transistor characteristics can be controlled with high accuracy by forming a channel part having the crystalline state of FIG. 5A in accordance with an embodiment of the present invention. Furthermore, the FET mobility (carrier mobility) of the thin film transistors TFT was 12 cm²/Vs. Thus, it has also been confirmed that a sufficiently favorable transistor characteristic can be achieved as a characteristic of pixel switches.

Type of FIG. 5A, GaN laser, NA=0.6, the cycle P of the crystal grain boundaries a is 400 nm.

Working Examples 2-1 and 2-2

Plural thin film transistors were formed by employing the crystallization step described with FIG. 5B (see FIGS. 1A and 1B).

Specifically, initially the semiconductor thin film 5 similar to that in Working Example 1 was deposited, and then polycrystallization of the active region 5a was carried out with different irradiation conditions of the laser light Lh from those in Working Example 1. A GaN laser was used as the laser light Lh, and the spot shape thereof was set to a circular shape of which spot diameter r2 in the direction of the channel length L was 500 nm. The effective numerical aperture NA of an objective lens was 0.8. In the crystallization step for the semiconductor thin film 5, the shift pitch p2 in the direction of the channel length L was 400 nm, and the scanning speed vt in the scanning direction y perpendicular to the direction of the channel length L was 1 m/s. The plate-surface irradiation energy was 12 mW. Similarly to Working Example 1, focus servo was performed and a part of the emitted beam was monitored during the irradiation of the semiconductor thin film 5 with the laser light Lh.

As a result of the crystallization step, the active region 5a became a polycrystalline region in which the plural crystal grain boundaries a were provided with a cycle P of 400 nm in the direction of the channel length L and the crystal grains b each ranging between the crystal grain boundaries a-a and each having a crescent shape convex in the opposite direction of the scanning direction y were arranged along the crystal grain boundaries a. As the size of each crystal grain b, the maximum width thereof in the scanning direction y (the width of "belly part" of the crescent) was about 150 nm.

Subsequent to the crystallization step, in a manner similar to Working Example 1, the active region 5a was so patterned that the length thereof in the direction substantially parallel to the crystal grain boundaries a (i.e., the channel width W) was set to 50 μm. Subsequently, the gate electrode 9 was formed with intermediary of the gate insulating film 7. The line width of the gate electrode 9 (i.e., the channel length L) was 10 μm and 20 μm in Working Examples 2-1 and 2-2, respectively. Therefore, the number of the crystal grain boundaries a that were provided under the gate electrode 9 to traverse the active region 5a was 25 and 50 in Working Examples 2-1 and 2-2, respectively.

Thereafter, the source/drain 11 were formed in the active region 5a on both the sides of the gate electrode 9, so that the plural thin film transistors TFT having the same standards were formed over the substrate 3 in each of Working Examples 2-1 and 2-2.

The on-state current of each of the obtained thin film transistors TFT was measured. As a result of the measurement, the variation ±σ in the on-state current was as small as ±1.9% and ±1.3% in Working Examples 2-1 and 2-2, respectively

TABLE 1

|  | Channel length L | Channel width W | The number of crystal grain boundaries a (the number of Cycles) | Variation in on-state current ±σ | Variation in Vth | Mobility (cm²/Vs) |
| --- | --- | --- | --- | --- | --- | --- |
| Working Example 1 | 20 μm | 50 μm | 50 | ±1.5% | 0.06 V | 12 |

(refer to Table 2 shown below). The variation in the threshold voltage Vth in Working Examples 2-1 and 2-2 was also as small as 0.08 V and 0.06 V, respectively. These results show that transistor characteristics can be controlled with high accuracy by forming a channel part having the crystalline state of FIG. 5B in accordance with an embodiment of the present invention. Furthermore, the FET mobility was 26 cm²/Vs in both Working Examples 2-1 and 2-2. Thus, it has also been confirmed that a sufficiently favorable transistor characteristic can be achieved as a characteristic of pixel switches.

TABLE 2

| | Channel Length L | Channel Width W | The Number of Crystal grain boundaries a (The Number of Cycles) | Variation in On-state Current ±σ | Variation in Vth | Mobility (cm²/Vs) |
|---|---|---|---|---|---|---|
| Working Example 2-1 | 10 μm | 50 μm | 25 | ±1.9% | 0.08 V | 26 |
| Working Example 2-2 | 20 μm | | 50 | ±1.3% | 0.06 V | 26 |

Type of FIG. 5B, GaN laser, NA=0.8, the cycle P of the crystal grain boundaries a is 400 nm.

Moreover, the results in Table 2 show that if the same laser-crystallized semiconductor film is used, a larger number of crystal grain boundaries a (a larger number of cycles) offers a thin film transistor with smaller variation in the on-state current, i.e., with higher characteristic accuracy.

Working Examples 3-1 and 3-2

Similar to Working Examples 2-1 and 2-2, plural thin film transistors were formed by employing the crystallization step described with FIG. 5B.

Specifically, in Working Examples 3-1 and 3-2, the crystallization step was carried out in the same manner as Working Examples 2-1 and 2-2, except that the irradiation conditions of the laser light Lh were different as follows: the effective numerical aperture NA of an objective lens was 0.4, the pitch p2 was 600 nm, and the scanning speed vt in the scanning direction y was 3 m/s.

As a result of the crystallization step, the active region 5a became a polycrystalline region in which the plural crystal grain boundaries a were provided with a cycle P of 600 nm in the direction of the channel length L and the crystal grains b each ranging between the crystal grain boundaries a-a and each having a crescent shape convex in the opposite direction of the scanning direction y were arranged along the crystal grain boundaries a. As the size of each crystal grain b, the maximum width thereof in the scanning direction y (the width of "belly part" of the crescent) was about 100 nm.

Subsequent to the crystallization step, in a manner similar to Working Example 1, the active region 5a was so patterned that the length thereof in the direction substantially parallel to the crystal grain boundaries a (i.e., the channel width W) was set to 50 μm. Subsequently, the gate electrode 9 was formed with intermediary of the gate insulating film 7. The line width of the gate electrode 9 (i.e., the channel length L) was 10 μm and 20 μm in Working Examples 3-1 and 3-2, respectively. Therefore, the number of the crystal grain boundaries a that were provided under the gate electrode 9 to traverse the active region 5a was 17 and 33 in Working Examples 3-1 and 3-2, respectively.

Thereafter, the source/drain 11 were formed in the active region 5a on both the sides of the gate electrode 9, so that the plural thin film transistors TFT having the same standards were formed over the substrate 3 in each of Working Examples 3-1 and 3-2.

The on-state current of each of the obtained thin film transistors TFT was measured. As a result of the measurement, the variation ±σ in the on-state current was as small as ±0.94% and ±0.56% in Working Examples 3-1 and 3-2, respectively (refer to Table 3 shown below). The variation in the threshold voltage Vth in Working Examples 3-1 and 3-2 was also as small as 0.10 V and 0.06 V, respectively. These results show that transistor characteristics can be controlled with high accuracy by forming a channel part having the crystalline state of FIG. 5B in accordance with an embodiment of the present invention. Furthermore, the FET mobility was 18 cm²/Vs in both Working Examples 3-1 and 3-2. Thus, it has also been confirmed that a sufficiently favorable transistor characteristic can be achieved as a characteristic of pixel switches.

TABLE 3

| | Channel Length L | Channel Width W | The Number of Crystal grain boundaries a (The Number of Cycles) | Variation in On-state Current ±σ | Variation in Vth | Mobility (cm²/Vs) |
|---|---|---|---|---|---|---|
| Working Example 3-1 | 10 μm | 50 μm | 17 | ±0.94% | 0.10 V | 18 |
| Working Example 3-2 | 20 μm | | 33 | ±0.56% | 0.06 V | 18 |

Type of FIG. 5B, GaN laser, NA0.4, the cycle P of the crystal grain boundaries a is 600 nm.

(a process improvement is reflected in these results)

Moreover, the results in Table 3 also show that if the same laser-crystallized semiconductor film is used, a larger number of crystal grain boundaries a (a larger number of cycles) offers a thin film transistor with smaller variation in the on-state current, i.e., with higher characteristic accuracy.

COMPARATIVE EXAMPLE

Plural thin film transistors were formed by employing a crystallization step with use of an excimer laser based on an existing configuration.

Specifically, initially the same semiconductor thin film 5 as that in Working Example 1 was deposited. Subsequently, the semiconductor thin film 5 was irradiated with pulses of a KrF excimer laser processed into a line beam of which width in the optical minor axis direction thereof was 400 μm. In this irradiation step, the irradiation position was shifted by a pitch of 8 μm in the minor axis direction for every pulse so that most of the respective irradiated regions overlapped with each other. The energy profile of the line beam, evaluated on a section parallel to the minor axis, was set to a top-hat shape (trapezoidal shape). Due to this irradiation condition, the same region was irradiated with about 50 shots of the pulse laser. The irradiation period of one pulse of the laser was 25 ns. The energy density of the laser was adjusted to 310 mJ/cm$^2$ by using an attenuator. The crystalline region resulting from the irradiation was observed with a secondary electron microscopy (SEM). As a result, it was confirmed that rectangular crystals of about 250 nm square had been obtained.

Thereafter, in a manner similar to Working Example 1, the plural thin film transistors TFT were formed of which channel length L (the line width of the gate electrode) and channel width W were 20 μm and 50 μm, respectively.

Transistor characteristics of each of the obtained thin film transistors TFT were measured. The measurement results are shown in Table 4. Table 4 also shows the results of Working Examples having the same standards as those of the comparative example (the channel length L=20 μm, the channel width W=50 μm).

TABLE 4

| | Energy Beam | Crystalline Shape | Variation in On-state Current ±σ | Variation in Vth | Mobility (cm$^2$/Vs) |
|---|---|---|---|---|---|
| Working Example 1 | GaN Laser NA = 0.6 | FIG. 5A | ±1.5% | 0.06 V | 12 |
| Working Example 2-2 | GaN Laser NA = 0.8 | FIG. 5B | ±1.3% | 0.06 V | 26 |
| Working Example 3-2 | GaN Laser NA = 0.4 | | ±0.56% | 0.06 V | 18 |
| Comparative Example | Excimer Laser | | ±6.2% | 0.31 V | 155 |

Channel length L=20 μm, channel width W=50 μm.
(a process improvement is reflected in the result of NA=0.4)

Table 4 shows that the variations in the on-state current and the threshold voltage Vth are smaller in the thin film transistors of Working Examples 1 to 3 according to an embodiment of the present invention compared with the thin film transistors of the comparative example, which did not employ an embodiment of the present invention. As for the FET mobility, although the comparative example shows a higher value, the values of Working Examples 1 to 3 are also sufficiently favorable as values of pixel switches.

Furthermore, in any of Working Examples 1 to 3, in which the effective numerical apertures NA of an objective lens used for the laser irradiation are different from each other, variation in the on-state current is smaller than that in the comparative example, which did not employ an embodiment of the present invention.

According to the above-described results, it has been confirmed that if thin film transistors to which an embodiment is applied are used as switching elements for pixel electrodes in a display employing organic electro-luminescence elements, variation in the luminance among the pixels in the display can be suppressed sufficiently.

Note that the respective Working Examples and the comparative example were performed based on an experimental process. The results on Working Examples 3-1 and 3-2 reflect an improvement in the process (specifically, handling skill) compared with the other examples.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin film semiconductor device comprising:
   a semiconductor thin film having an active region turned into a polycrystalline region through irradiation with an energy beam; and
   a gate electrode provided to traverse the active region;
   wherein successive crystal grain boundaries extend along the gate electrode in a channel part that is a portion of the active region overlapping with the gate electrode,
   the crystal grain boundaries traverse the channel part and are provided cyclically in a channel length direction, and
   crystal grains each having a crescent shape are provided between the crystal grain boundaries and are arranged along an extension direction of the crystal grain boundaries, the crescent shape having a curved convex side that is convex in the extension direction of the crystal grain boundaries and a curved concave side opposite to the convex side,
   wherein the number of the crystal grain boundaries provided in the channel part is set to a predetermined number greater than or equal to 17 and less than or equal to 50.

2. The thin film semiconductor device according to claim 1, wherein the active region is a region in which at least the whole of the channel part is turned into a polycrystalline region.

3. The thin film semiconductor device according to claim 1, wherein the crystal grain boundaries arise from parallel scanning of the energy beam with a predetermined pitch and are parallel to a scanning direction of the energy beam.

4. The thin film semiconductor device according to claim 1, wherein a distance between the crystal grain boundaries is between 400 nm and 600 nm.

5. The thin film semiconductor device according to claim 1, wherein a length of the channel part ranges from 10 μm to 20 μm.

* * * * *